United States Patent

Silfvast et al.

Patent Number: 5,524,060
Date of Patent: Jun. 4, 1996

[54] VISUASL DYNAMICS MANAGEMENT FOR AUDIO INSTRUMENT

[75] Inventors: Robert D. Silfvast, Palo Alto; Scott W. Silfvast, La Honda; Edward G. Fay, San Rafael; Philip R. Wiser, Mt. View, all of Calif.

[73] Assignee: Euphonix, Inc., Palo Alto, Calif.

[21] Appl. No.: 195,982

[22] Filed: Feb. 14, 1994

Related U.S. Application Data

[63] Continuation-in-part of Ser. No. 854,730, Mar. 23, 1992, abandoned.

[51] Int. Cl.⁶ ............................. H03G 3/00; H04B 1/00
[52] U.S. Cl. .................... 381/104; 381/106; 381/119; 345/145
[58] Field of Search ............................ 381/119, 104, 381/106, 161; 345/134, 135, 145, 167, 173, 157; 364/188; 395/100, 104, 106, 155, 159

[56] References Cited

U.S. PATENT DOCUMENTS

| | | | |
|---|---|---|---|
| 4,550,425 | 10/1985 | Andersen et al. | 381/106 |
| 4,741,018 | 4/1988 | Potratz et al. | 381/106 |
| 4,742,473 | 5/1988 | Shugar et al. | 364/518 |
| 4,761,640 | 8/1988 | Slavin | 345/134 |
| 4,761,816 | 8/1988 | Fukusawa | 381/106 |
| 4,835,528 | 5/1989 | Flinchbaugh | 345/157 |
| 4,991,218 | 2/1991 | Kramer | 381/61 |
| 4,998,960 | 3/1991 | Rose et al. | 84/622 |
| 5,050,217 | 9/1991 | Orban | 381/106 |
| 5,077,520 | 12/1991 | Schweitzer, Jr. | 324/133 |
| 5,150,714 | 9/1992 | Green | 128/660.06 |
| 5,212,733 | 5/1993 | Devitt et al. | 381/119 |
| 5,477,263 | 12/1995 | Nanbu | 345/145 |

OTHER PUBLICATIONS

"Digi design Turbosynth Synthesis Software", Music Technology, Sep. 1988, pp. 72–75.

Primary Examiner—Forester W. Isen
Assistant Examiner—Xu Mei
Attorney, Agent, or Firm—Donald R. Boys

[57] ABSTRACT

A digital audio gain control system has an operator interface with a CPU, RAM storage, and input devices for a user to store transfer characteristics relating gain to be applied to an incoming audio signal to the signal strength of that incoming signal. A communication link allows the transfer characteristic function to be sent to a RAM in a separate patchable amplifier unit having a DSP and RAM, and level detection circuitry for monitoring the signal strength of an incoming audio signal and applying gain according to the transfer characteristic communicated to the on-board RAM. The amplifier unit also sends operating information back to the operator interface, where operation may be displayed to aid an operator in adjusting the function.

21 Claims, 14 Drawing Sheets

SPECIFICATIONS FOR DYNAMICS MODULES

| Name | Min | Max | Resolution | Control | Comment |
|---|---|---|---|---|---|
| Exp. Threshold | -50 dB | +10 dB | 0.5 dB | 2 bits/337.50 deg | linear |
| Exp. Ratio | 1:1 | INF:1 | 100 steps | 2 bits/381.25 deg | 3 or 5:1 @ center |
| Exp. Sharpness | 1% | 100% | 1% | 2 bits/281.25 deg | linear |
| Exp. Depth | 0 dB | -60 dB | 0.5 dB | 2 bits/337.50 deg | linear |
| Exp. Attack | .1 ms | 100 ms | 100 steps | 2 bits/281.25 deg | log |
| Exp Release | 50 ms | 5 s | 100 steps | 2 bits/281.25 deg | log |
| Exp. Hold | 10 ms | 10 s | 100 steps | 2 bits/281.25 deg | log |
| Cmp. Threshold | -40 dB | +20 dB | 0.5dB | 2 bits/337.50 deg | linear |
| Cmp. Ratio | 1:1 | INF:1 | 100 steps | 2 bits/281.25 deg | 3 or 5:1 @ center |
| Cmp. Sharpness | 1% | 100% | 1% | 2 bits/281.25 deg | linear? Check feel |
| Cmp. Makeup | 0 dB | 24 dB | 0.5dB | 4 bits/270.00 deg | linear |
| Cmp. Attack | .1 ms | 100 ms | 100 steps | 2 bits/281.25 deg | log |
| Cmp. Realease | 50 ms | 5 s | 100 steps | 2 bits/281.25 deg | log |
| Cmp. Hold | 10 ms | 10 s | 100 steps | 2 bits/281.25 deg | log |

Fig. 7D

VISUASL DYNAMICS MANAGEMENT FOR AUDIO INSTRUMENT

CROSS REFERENCE TO RELATED APPLICATIONS

This is a continuation-in-part of application Ser. No. 07/854,730 filed Mar. 23, 1992, now abandoned.

FIELD OF THE INVENTION

The present invention is in the area of instruments and systems for managing and mixing audio input for production purposes, such as performances and recordings, and pertains particularly to automated dynamic range control for audio signals.

BACKGROUND OF THE INVENTION

Audio production for television, video, film, and recorded music sales is a large and growing enterprise, and is a basic element in much of the entertainment industry. Audio equipment, such as amplifiers, mixers, synthesizers, and the like, are under constant development as the basis for new products for audio engineers. As has been true in many other technical fields, computerization has become important in audio equipment, and many new products include some form of computerization.

Computerized equipment is becoming more and more important as the basis of technical advances in the audio control industry to provide ability to mix and process more sophisticated and more voluminous audio input, and to provide more flexibility in output. Computerization is also seen as a requirement for cost-effective competition. Manual instruments, systems, and techniques are, by comparison, increasingly more expensive to use.

In the very early days of music recording, after recording media became available, the approach to making a recording was quite simple. One merely turned on the recorder, which included an input device such as a horn or a microphone, while the audio phenomenon to be recorded was taking place, and the instrument recorded, as best it could, whatever audio was intercepted by the input device. The results were understandably somewhat crude.

As more advanced equipment became available, and a better understanding of audio principles was developed, a number of reasons for "poor" or incomplete recording have been discovered. A very important discovery involved the concept of "dynamic range". Dynamic range is defined as the difference between the lowest level and the highest level a system or device can effectively handle. The concept is applicable to both "sending" or transmitting equipment, and to receiving equipment.

The human ear, for example, has a dynamic range of about 120 dB. All of this range, though, is not always useful, and there is always "noise" to a level below which lower level useful signals are mixed, and become not readily discernable over the noise. The useful dynamic range of the human ear, also called signal to noise ratio (S/N ratio), is about 90 decibels.

Staying with the idea of this useful dynamic range, the useful range (S/N ratio) of a symphony orchestra is about 80–90 dB. The human ear, then, is quite capable of receiving and utilizing the full dynamic range of a symphony orchestra. The difficulty arises when the useful range of various audio devices and instruments is considered. For example, the useful range of a state-of-the-art compact disk is about 96 dB, of a high quality microphone about 75 dB, of a digital tape recorder about 96 dB, of an analog tape recorder about 65–70 dB, and of an FM transmission about 60 dB. A normal telephone line has a typical useful range of about 45 dB.

It is easy to see from the above information that most audio devices, even state-of-the-art, high quality devices, have a useful range less than that of the human ear, and in some cases, less than the range of an orchestra, or some other audio event, which one might want to record.

The apparent problem, then, is that one cannot always record the full range of an audio phenomenon to render it essentially unchanged at a later time to the human ear, without having some means of reducing, or compressing, the audio input to a range within the capability of the audio instrument intended to be used, and then expanding the recorded phenomena when it is later played, back to its original audio range, or even more.

Over the years of development of audio equipment, such as receiving, recording, and playback equipment, devices have been developed to alter level in an audio operation performed by an audio instrument. Such devices are generally termed amplifiers, although they may also act to attenuate signals. Early amplifiers were fixed-gain devices, and variable-gain devices were developed later. Among variable-gain amplifiers there are compressors, gates, limiters, and expanders.

Briefly, a compressor is a device that receives an audio signal having a dynamic range of $R_1$ and puts out (or transmits) the signal with a new dynamic range of $R_2$, where $R_2<R_1$. The ratio of $R_1$ to $R_2$ is called the compression ratio of the compressor.

A good example of use of a compressor is in a hypothetical case involving a desire to record a signal having a dynamic range broader than the dynamic range of the recording medium desired to use. A compressor may be employed to receive the signal, compress its dynamic range, and pass it on the recording medium with a new range within the range of the recorder. An expander might be used at a later time to receive the signal from the recording medium and to restore the original dynamic range before the signal is transmitted to an output device, such as a speaker (or a series of speakers). Both compressors and expanders may have a threshold, such that the compressing or expanding effect is only active above (for a compressor) or below (for an expander) a certain dB level.

A gate is also often called a noise gate, and is an expander set to sharply attenuate any input that falls below threshold. A gate is used to "clean up" noise. A limiter is a compressor whose compression ratio, defined as the ratio of input to output dynamic range, is equal or greater than about ten to one. A limiter is typically used at the high end of an input range to convert input to essentially constant output level.

Beyond the problems of varying dynamic range to accommodate the range limitations of different devices and systems, dynamic range control is also useful for altering audio signals to create special audio effects to enhance the perceived audio quality of a signal.

Audio level dynamic range control is arguably one of the most important and essential capabilities for any kind of audio equipment, all the way from simple devices to complicated mixer boards. Yet audio level dynamics processors have always been, and are still, before the present invention, implemented by such devices as rotary and slide potentiometers and switches typically hard-wired to the devices they control, and visual feedback is limited to lights, LED's, meters, and simple displays on monitor screens. The use of potentiometers and the like to control amplifiers for audio dynamics is quite limiting due to temporal factors, as well as wide variance in characteristics of such devices. Moreover, it is difficult for a sound engineer to know what he or she has done until it is too late to make a reasonable correction. Another drawback is that there is no way to save a successful or desirable "gain riding" configuration to recall and use at a later time, Some of the information in the background section of this specification is taken from a book titled "Sound Recording Handbook" by John M. Woram and published by Howard W. Sams and Co., a division of Macmillan, Inc., Copyright 1989 by John M. Woram. The concepts and devices typically used in audio dynamics are the subject of Chapter 8, which is a good basic treatment of the subject matter.

What is needed is a new way to set audio dynamics for variable gain amplifiers with visual feedback to provide a visual interpretation of how a signal is being processed, to control with high resolution and accuracy, and to be able to return to successful characteristics and parameters as a starting point for new applications.

SUMMARY OF THE INVENTION

In an embodiment of the present invention a system is provided for generating an output audio signal by selectively varying gain applied to an input audio signal. The system comprises a variable-gain amplifier for receiving the input audio signal, applying the gain, and providing the output audio signal. The amplifier is responsive to a control signal, and varies gain proportional to the control signal. The system has an electronic storage for storing a function relating the gain to be applied to the signal strength of the input audio signal and a communication link for a user to store the function in the electronic storage. A level detection unit monitors the input audio signal and provides a signal to a microprocessor proportional to the signal strength of the input audio signal. The microprocessor reads gain values from the electronic storage according to the input signal proportional to the signal strength of the input audio signal, and generates the control signal fed to the variable-gain amplifier, which then varies the gain applied to the input audio signal to provide the output audio signal.

In a useful embodiment the electronic storage is RAM memory and the function is stored as a look-up table with addresses representing signal strength for the input audio signal, and data values representing gain to be applied to the input audio signal depending on the signal strength of that signal. Time consents may also be related to the function, stored, and applied to the time that gain is changed.

An operator interface is provided according to an embodiment of the invention with input devices related to a display screen for an operator to define a function, also called a transfer characteristic, and to store the function for use by the variable-gain amplifier. The display at the interface also displays a graph while a signal is processed, showing the transfer function in either of two ways: one with gain to be applied related to input audio signal strength, and the other with output audio signal strength displayed related to input audio signal strength. The graph display in one embodiment has a dynamic follower on the graph of the transfer characteristic, which moves along the curve in response to variations in signal strength. Optionally other followers may be displayed showing the x-axis and y-axis values separately.

The system according to the present invention provides maximum flexibility to an operator, allows transfer characteristics to be stored and recalled, and provides also a unique display to guide an operator in adjusting gain application to audio signals.

BRIEF DESCRIPTION OF THE DRAWINGS

FIG. 7D is a table of specifications for dynamics modules in an embodiment of the present invention.

DESCRIPTION OF THE PREFERRED EMBODIMENTS

A basic instrument of audio production is the production mixing console, a workstation that presents an interface to a sound engineer through which he or she may condition multiple channels of audio input, and mix the conditioned results into mono or stereo outputs for direct broadcast or for recording. A production mixing console, hereinafter a mixer, typically presents arrays of input devices, such as switches, knobs, and faders, for a sound engineer to set to condition and route audio signals. A fader is typically a slide potentiometer through which an amplitude may be adjusted as a result of the linear position of the input lever relative to a track.

Mixers typically route audio input signals to individual channels, and each such channel has a repetitive layout of switches, knobs, and faders. For example, a single channel can have more than one input, such as a microphone input and an input from an instrument, a group of instruments, or a tape. Using the controls on a mixer an engineer can select microphone, line, and tape inputs, route the inputs to signal conditioning devices like faders and equalizers, and mix and route the output from the conditioning devices as well. There is typically a selective ability to monitor audio signals, such as by headphones, and often a microphone for talk back by the sound engineer operating the console.

A full-function audio mixer system is perhaps the most sophisticated example available of an audio instrument for which audio dynamics control is useful and even necessary. Virtually all such systems in the art have a dynamics "section" comprising knobs, sliders, switches, and display devices such as LED's, for implementing audio dynamics control. The inventors in the present instance have developed and market a sophisticated audio mixer system, including a console, and this system is a good vehicle for describing the present invention, and is used as such herein. The invention described, however, has application broadly for instruments and systems in general where audio dynamics control is useful, and is implemented in a modular form that may be used with the mixer system, or with other audio systems.

Figure 1:
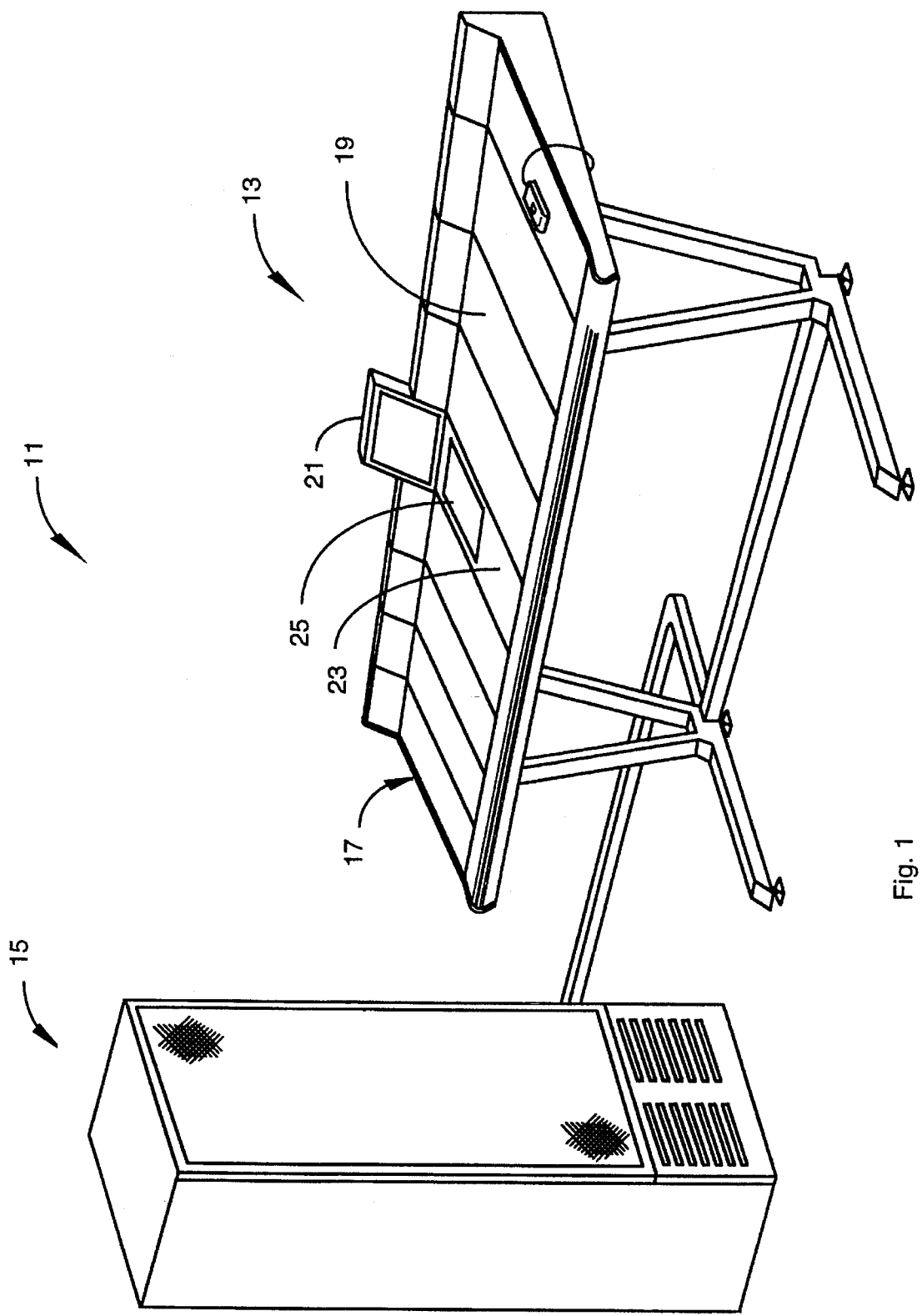
FIG. 1 is an isometric illustration of an audio mixer system used in an embodiment of the present invention.

FIG. 1 is an isometric view of an audio mixer system 11 comprising a control section 13 and an audio tower 15. The control section comprises a console 17, and the console includes a plurality of removable modules plugged into bays, such as module 19. In this audio mixer system, an electronic display 21 is built into a plug-in module 23 that includes in this embodiment of the invention a dynamics section 25 comprising a matrix of selection switches and rotary encoders (not shown in FIG. 1). Audio dynamics parameters for signals processed by the system are set by manipulation in dynamics section 25 in combination with visual feedback on monitor 21. Monitor 21 is a flat panel display in the embodiment described herein, but could as well be a monitor connected to a microcomputer used in conjunction with the audio system.

In the audio mixer of the present invention, a plurality of input and output signals may be monitored and routed in a variety of ways, and mixed and output in various ways as well. For example, each channel has a plurality of inputs which may be summed and routed through an input amplifier, and the final product, a conditioned mix of the input signals, may also be passed through an amplifier before being routed to output equipment, such as recording media or speakers. The amplifiers used in the present invention are variable-gain amplifiers, and are voltage controllable. In a preferred embodiment of the present invention described below, the amplifier associated with the control according to the invention is a module separate from the console and the audio tower shown in FIG. 1, and is "patched" into the console and the audio tower through a patch bay (not shown) that is incorporated in the audio tower. This peripheral implementation is not a limitation on the invention, however, but merely a convenience: as amplifiers and control elements according to the invention may also be implemented as a part of either the console or the audio tower, or in other embodiments as well.

Figure 2:
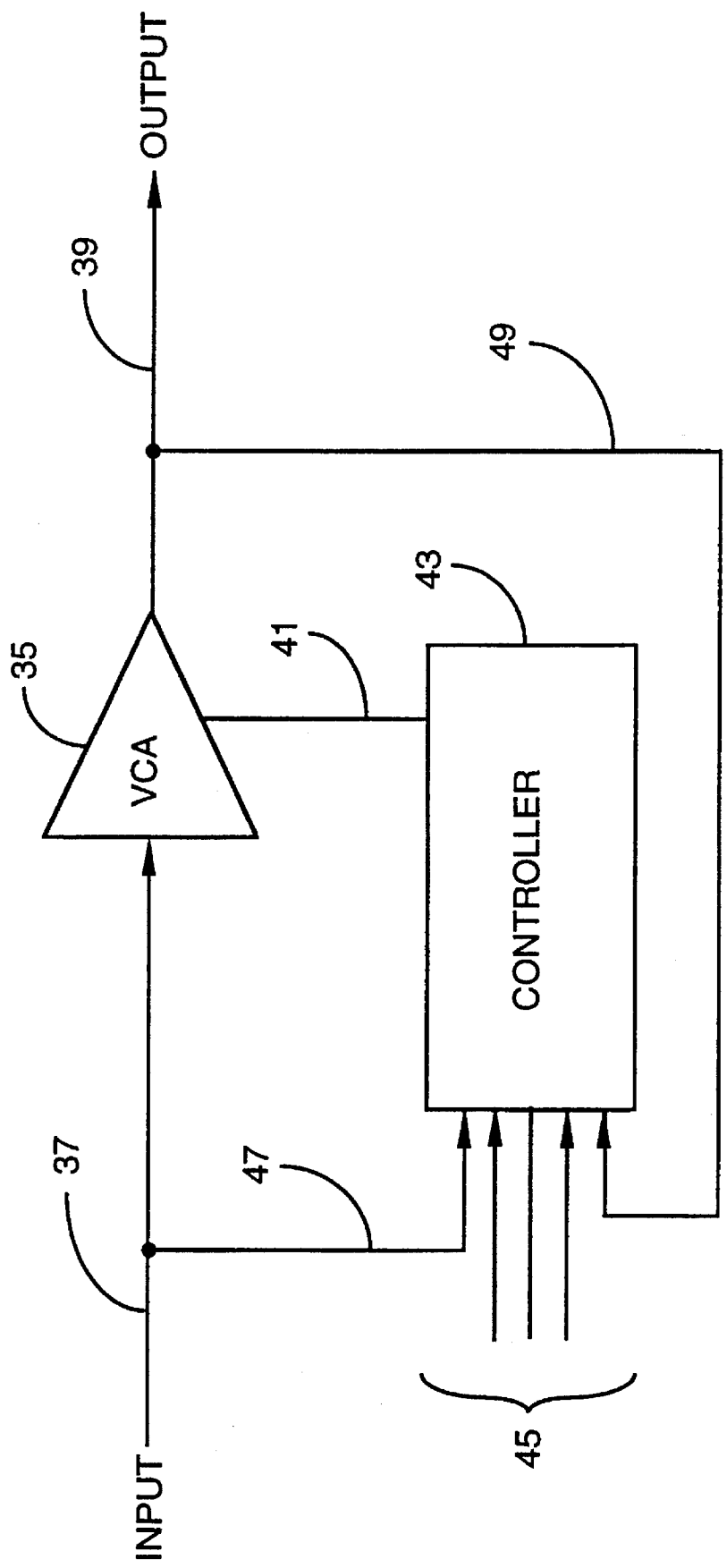
FIG. 2 is a diagram of a voltage controllable amplifier with a controller.

FIG. 2 is a schematic diagram showing a voltage controlled amplifier (VCA) 35 having an input line 37 and an output line 39. The gain applied by VCA 35 to the input signal is proportional to a voltage imposed on the VCA via control line 41 from a control section 43. The control voltage on control line 41 is a function of a variety of inputs 45 to controller 43. Among the inputs is a sensing line 47 which tracks the input level. The output provided by the VCA is a function of the input level. An optional input is a sensing line 49, sensing the output level.

Before the present invention, controller 43 has typically been hard-wired conventional circuitry responding directly to variations in individual ones or combinations of inputs 45, which includes the input on line 47 and optional output sensing lines 49.

As an example typical of the prior art, one of the input lines might be a slide or rotary variable resistor to set a constant bias to provide a constant gain, such that whatever the input level, the output is a fixed amount higher. Another option in the prior art might be a slide or rotary variable resistor to set a voltage multiplier or divider to act in conjunction with the input sensor to vary the gain in a linear fashion across the full range of the input. This input would set a ratio for either expansion or compression of the signal, both of which are more fully explained below. It is also known in the art to set thresholds for variable gain regions relative to the input, by appropriate manipulation of the hard wired circuitry of the controller section.

Figure 3:
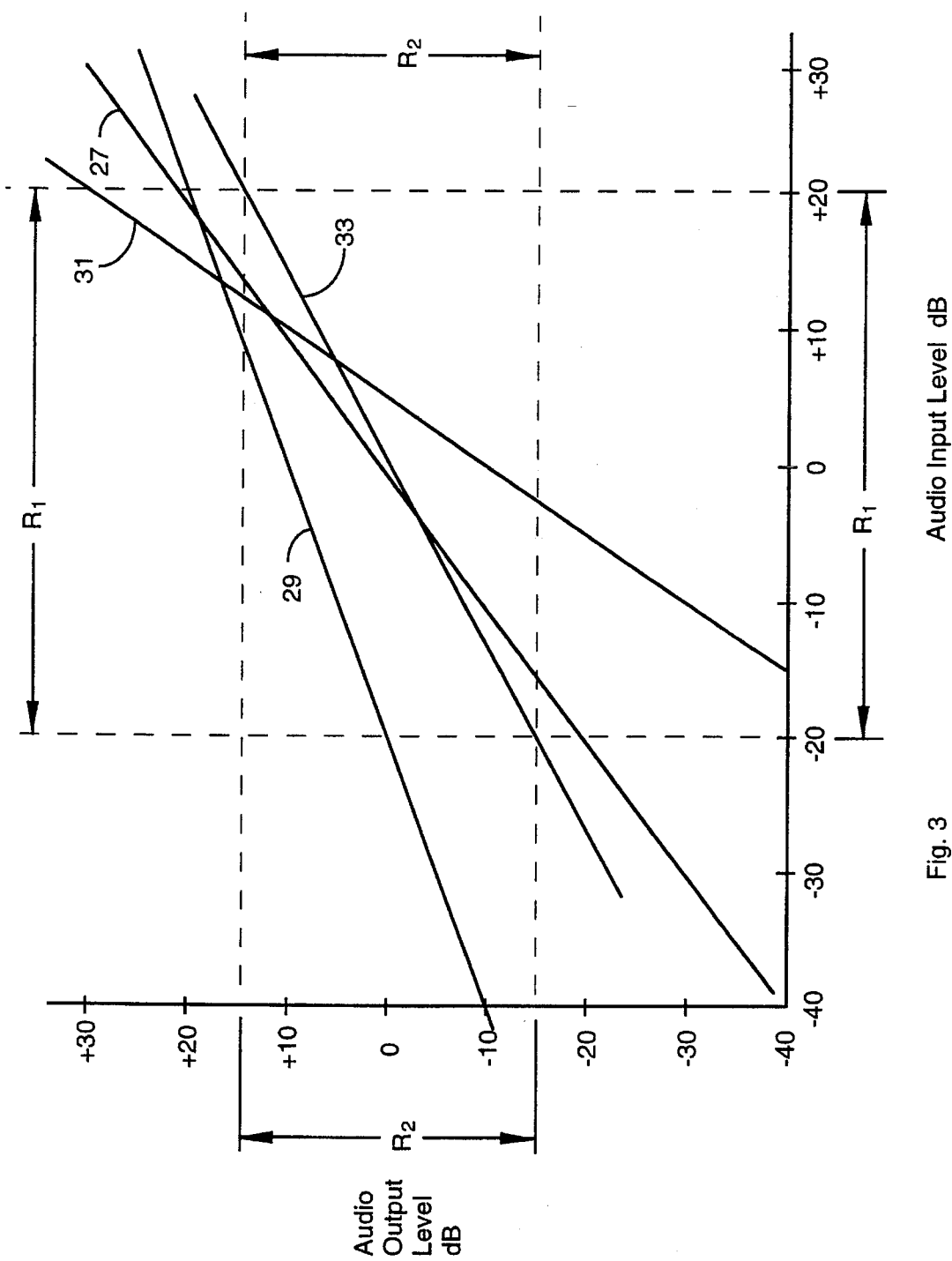
FIG. 3 is an example of straight-line transfer characteristics in a graph of output vs input for an audio amplifier.

FIG. 3 is a graphic representation of input vs. output for an amplifier related in dB. A similar display is used in the present invention to illustrate setting of parameters for visual audio dynamics control. Line 27 in the graph of FIG. 3 may be termed a "transfer characteristic" for controlling an amplifier, and this term is used extensively below in descriptions of embodiments of the present invention. In a graph of output as a function of in:put, as shown in FIG. 3, the plotted function is $y=f(x)$, and the function describes how the output of an amplifier is to be controlled with input as the independent variable.

Transfer characteristic 27 is a simple characteristic comprising a straight line on the graph. Transfer characteristics in the art, up to the time of the present invention, are typically formed of straight-line sections, and this limitation in the art is largely due to the way control is implemented. In the case of a straight-line characteristic, the line may be :represented by the mathematically familiar formula:

$$y=Ax+B$$

In this formula, y is the dB level of the output (the y-axis value), and x is the dB level of the input (the x-axis value).

In the case of a straight line characteristic, the gain is affected by both the A and B constant terms. Mathematically, A is the "slope" of the curve, and B is the "offset", in this case in the vertical direction. If slope A=1, the line is at a 45 degree angle on the graph. For characteristic 27, A=1 and B=0. so y=x. A characteristic with a slope of 1 and to offset is said to have unity gain. That is, to obtain the output value (y), the input value (x) is multiplied by 1, and there is no B term to add or subtract.

If B is 0, the transfer characteristic passes through the point 0,0 and as the multiplier changes, the transfer characteristic rotates around 0,0 in the graph. This is called the rotation point.

Transfer characteristic 29 in FIG. 3 is a straight-line characteristic for which A=0.5 and B=10. In this case, a variable gain amp following the characteristic acts as a compressor, because for any finite input range, the input signal will be output within a narrower range. The compression ratio is the reciprocal of the coefficient of x, in this case 2:1. The A term of the straight-line formula is less than 1 for a compressor, and greater than one for an expander. In the case of an expander, the expansion ratio is the coefficient of the x term. Characteristic 31 in FIG. 3 has the straight line formula with A=2 and B=−10. and a variable gain amp obeying this characteristic acts as an expander.

To illustrate the need for and use of expanders and compressors it is instructive to illustrate on the graph of FIG. 3 dynamic ranges for the input and output. The input range is illustrated by $R_1$, and extends from −20 dB to +20 dB. The output dynamic range is shown as $R_2$, and extends from −15 dB to +15 dB. The lower threshold (−15 dB) of the output range is typically the noise threshold, and the tipper (15 dB) is the level above which the output signal will be distorted. The output range may be for the variable gain amplifier, or to express limitations of a device that may be fed by the controlled variable gain amplifier. For example, in a particular application, the amplifier for which the graph is shown may itself have a dynamic range larger than the input range, but may be feeding a recorder with a smaller range, hence a need for compression.

For the ranges $R_1$ and $R_2$ shown in FIG. 3, if transfer characteristic 27 is followed, it is easy to see that input between −20 dB and −15 dB will be output in the noise region below the lower end of range $R_2$, and input from +15 dB to +20 dB will be output above the tipper end of range $R_2$, and hence in the distortion region. A transfer characteristic may be easily determined, however, for compressing the input signal to the dynamic range allowable (or desired) for the output. One possibility is a compressor characteristic with y =0.75x, producing transfer characteristic 33, which compresses the input range just enough to put the output within the output range.

Having compressed the input signal by following a compressor transfer characteristic such as characteristic 33, to record an audio event on a medium with a lower dynamic range than that of the input signal, for example, one may then use an expander when the recording is played, to restore the broader original range.

Although it is relatively common in the art to have a single amp acting only as an expander or only as a compressor, it is known to control a variable gain amp to have both expansion regions and compression regions, and to have other features for specific purposes. In these instances, the device itself, that is, the variable-gain amp, may not accurately be called an expander or a compressor. The individual term will then refer to a region of a transfer characteristic rather than a device.

Figure 4:
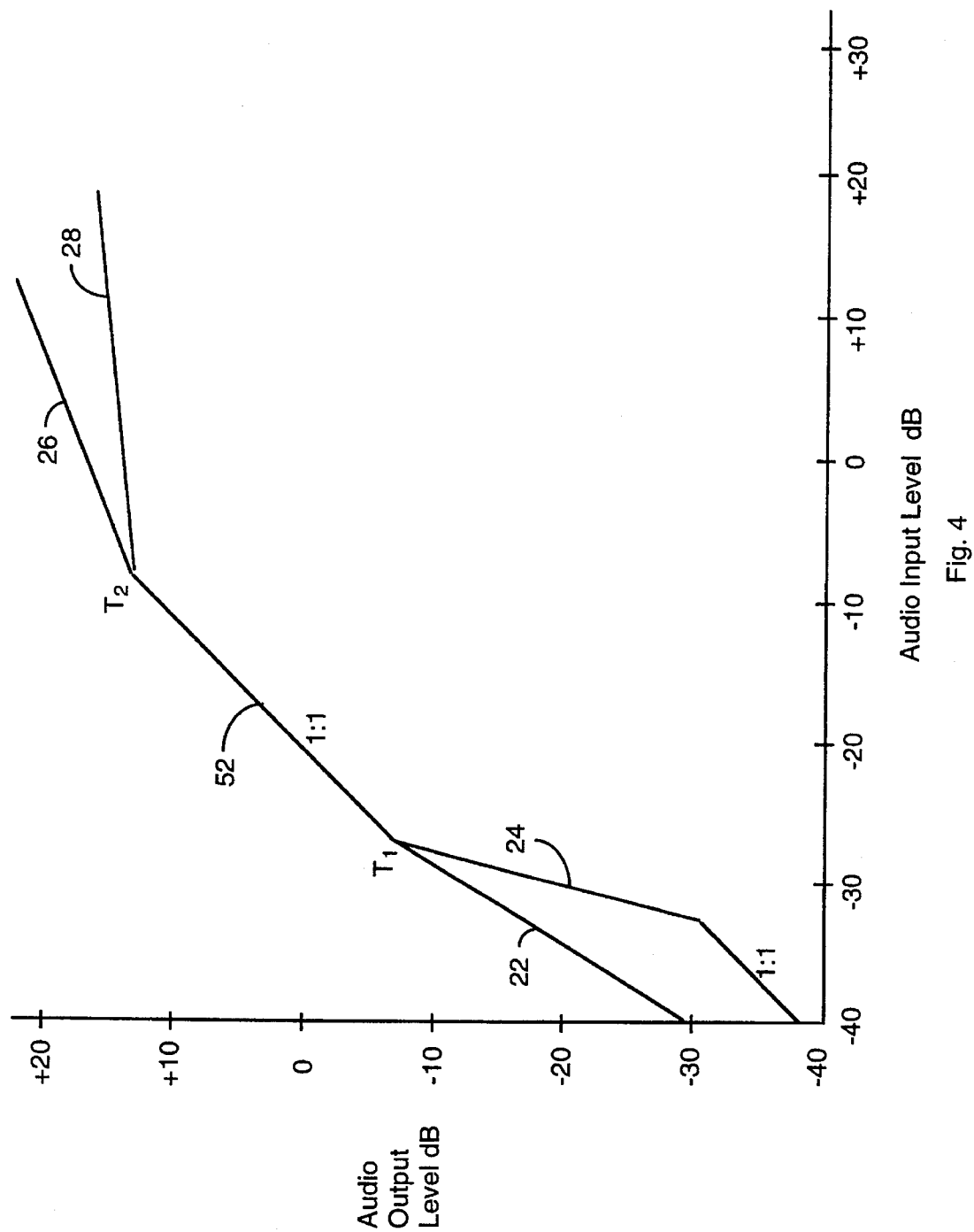
FIG. 4 is another graph of output vs input showing a combination transfer characteristic showing both expansion and compression of dynamic range.

FIG. 4 is a graph similar to the graph of FIG. 3 showing a selection of line segments representing expander, compressor, and unity gain regions of a transfer characteristic. Segment 22, extending from the y axis to point $T_1$, is an expander, and tends to attenuate input signals below $T_1$, which is the threshold of the expander portion. Segment 24 is an expander with a ratio greater than 10:1, and therefore a gate, tending to severely attenuate input signals below threshold, to the point that these signals are effectively excluded from the program, hence the "gate" term.

Segment 52 is a fixed gain region, wherein input is passed to output without gain alteration. Point $T_2$ is a compressor threshold, defined as the input point above which a compressor is active. Segment 26 is a compressor region with ratio about 2:1, which tends to compress signals above the threshold to a lesser dynamic range. If a compressor has a ratio of 10:1 or higher, such as segment 28, it is termed a limiter, and effectively limits the output above the compressor threshold. The example of FIG. 4 is but one of many options a sound engineer might use to manage the full range of an input signal to within a range allowed for the output.

There are a number of characteristics and phenomena conventionally associated with compression. "Breathing", also called "pumping", is a phenomenon that takes place near the threshold point of a compressor, and is caused by system gain riding tip and down with fluctuation of the input signal. Prior to the present invention, breathing has been addressed by selecting a lesser compression ratio, or by setting a longer release time. Release time is discussed below.

A compressor's "attack time" is the interval within which the output moves from its former gain to whatever gain is dictated by the compression ratio setting when the input level is rising. The attack time is typically adjustable over a range from 1 millisecond to 20 milliseconds or greater. A short (or zero) attack time offers maximum protection against high-level transients, but is not always the "best" selection. The reason is that sonic impacts of sharp musical attacks may be lost, leaving a dead or lifeless sound. In the case of percussive effects, for example, one might wish to lengthen attack time to preserve the percussive effect in compression.

"Release time" for a compressor is a time constant for applying a gain change when the input level is falling. A heavily compressed signal with a short (or zero) release time may cause audible breathing effects.

A limiter, as stated above, is a compressor with a compression ratio of 10:1 or greater. At such a high ratio, the output remains, for all practical purposes, at a constant level. The output signal above threshold is limited to a very narrow dynamic range.

An expander, as also stated above, is a variable-gain amplifier, or a portion of a transfer characteristic for a variable-gain amplifier, wherein the dynamic range of the output signal is greater than the dynamic range of the input signal. An expander or expander characteristic is used typically to restore a compressed signal to a former range. An expander has an expansion ratio, a rotation point, threshold level, attack time, and release time analogous to the same terms for a compressor.

A gate, also called a noise gate, is simply an expander, or expander portion of a transfer characteristic, whose parameters are set to sharply attenuate an input whenever it falls below threshold. Noise gates may be incorporated to clean up noisy input channels and to create a wide variety of special effects.

As stated above, with reference to FIG. 2, conventional controllers for audio dynamics are implemented with hardwired devices such as voltage multipliers, dividers, adders, and subtractors. As a result, an operator has but limited feedback, and the controls are subject to the vagaries of the devices used to implement the control.

In conventional systems it is common to have both an expander and a compressor portion to a transfer characteristic, but transfer characteristics are severely limited in form, and generally limited to those that can be expressed as combinations of straight-line segments. The present invention, through a unique interface and control system, provides an ability to provide transfer characteristics in a broad variety of functions of the form y=f(x). In the present invention a transfer characteristics is created at a user interface by defining the function y=f(x) and storing the result in an all-points-addressable RAM table, which is copied at frequent intervals to RAM at the controlled amplifier, and utilized by a digital signal processor in conjunction with tracked input to produce controlled output.

The use of RAM storage with an all-points-addressable table allows transfer characteristics having any function with a unique y value for each x value to be created and used, and also allows substantially real-time management of the transfer characteristic. Straight line implementation is no longer a limitation.

Figure 5:
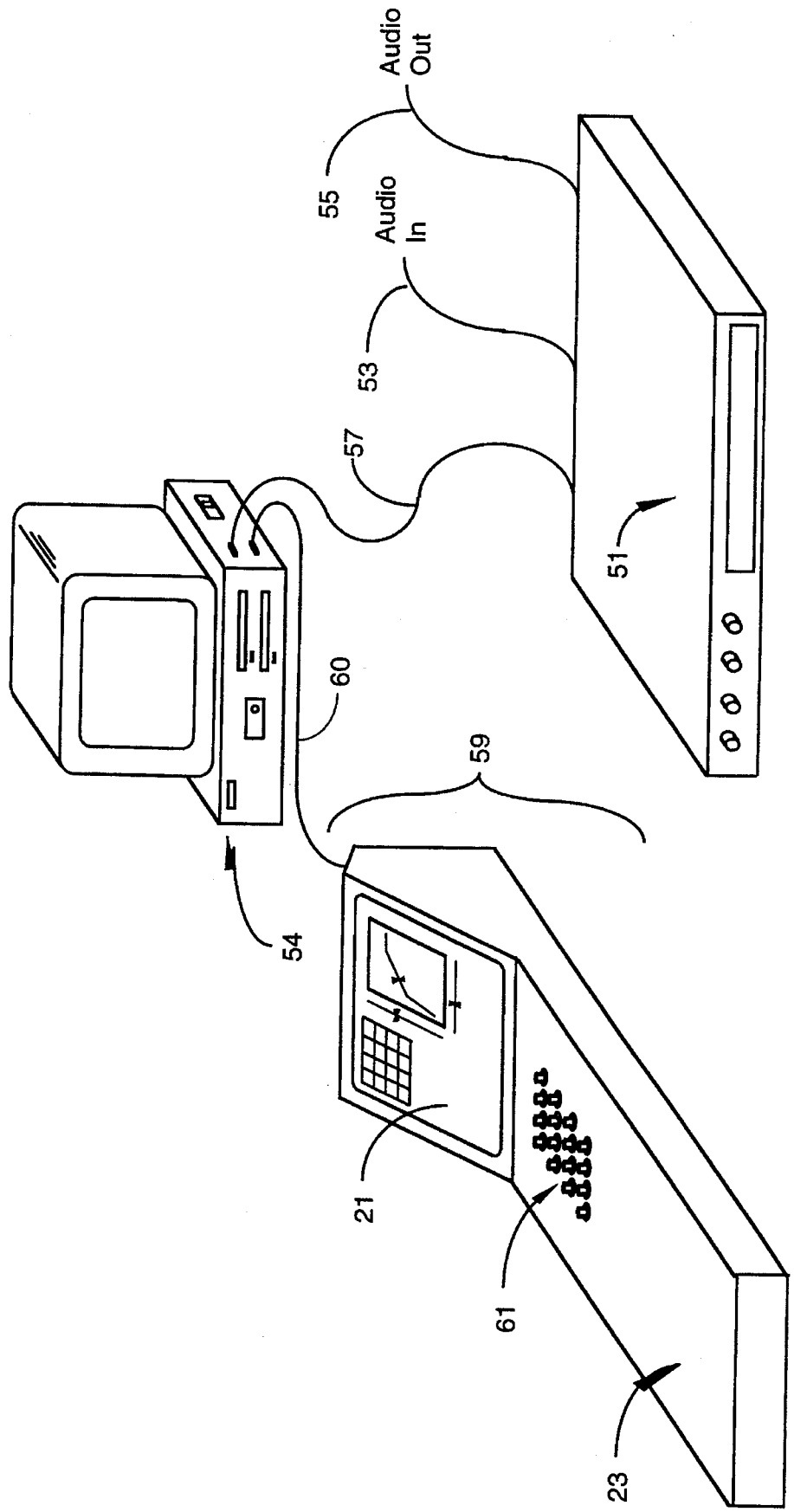
FIG. 5 is an isometric illustration of a module of a mixer console connected to a computer and a controlled amplifier according to an embodiment of the invention.

FIG. 5 is an isometric illustration illustrating an arrangement of elements and functions for visual audio dynamics control according to an embodiment of the present invention. In this embodiment a digitally controlled audio amplifier 51 is provided as a peripheral piece of equipment to the audio mixer system shown in FIG. 1. Audio input line 53 to amplifier 51 has a patch plug (not shown), as does audio output line 55, so the function of the amplifier according to the invention may be applied at a number of convenient locations relative to signal paths in the audio mixer, or as a controllable unit in other applications. Audio tower 15 (FIG. 1) has a patch bay allowing audio signals to be routed to and from the mixer system at a plurality of locations in the signal paths. It will be apparent to one with skill in the art that unit 51 may also be used in virtually any environment where it is desirable to practice dynamic level control to produce an altered output from an available audio input.

Control interface sub-system 59 in the embodiment illustrated by FIG. 5 is a part of console 13 in system 11 of FIG. 1, and implemented primarily in plug-in module 23. The interface comprises monitor 21 which displays control characteristics and metering elements to track performance in substantially real time, and an array of rotary encoders 61 mounted on the control surface in combination with selector switches and pushbuttons (not shown).

The encoder array is for providing selective input for various parameters for a transfer characteristic to be described more fully below. In the present embodiment management of the operator interface sub-system 59 is by a PC-compatible micro-computer 54 connected to the audio mixer system via a serial link 60, and amplifier unit 51 has an on-board microprocessor dedicated to digital signal processing (DSP). Digital communication to and from amplifier unit 51 in the embodiment described herein is accomplished over a second serial link 57.

Figure 6:
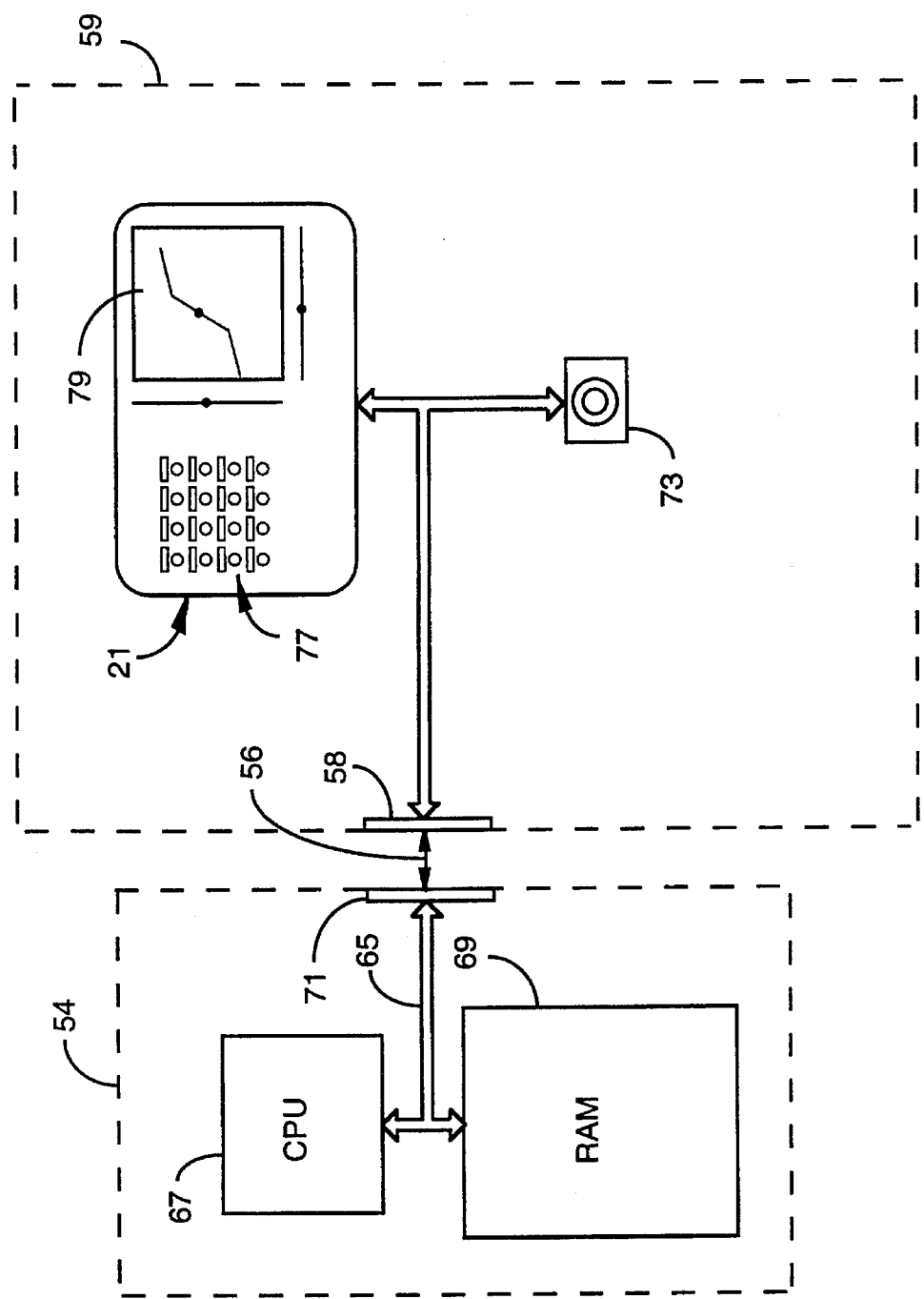
FIG. 6 is a block diagram of elements of a computer and a control interface for an embodiment of the present invention.

FIG. 6 is a schematic block diagram of elements of control interface 59 and microcomputer 54. It will be apparent to one with skill in the art that the control interface could also be implemented "on-line" using the components of the microcomputer installed in plug-in module 23 (FIG. 5), and that computers from other manufacturers operating with different operating systems could be used by making appropriate changes in the invention to provide equivalent capability to those described in the present embodiment.

Microprocessor 67 is the computer CPU and communicates on system bus 65 to RAM 69 and to connector 71. Monitor 21 is a part of module 23, and computer 54 drives the monitor through appropriate conventional connection to module 23 and the flat panel display. The connection is shown here as communication line 56, between connectors 71 and 58. One with skill in the art will recognize that there are a number of ways the communication may be accomplished. There are other peripherals on the system bus, not shown here, such as a floppy disk drive for uploading and downloading software. CPU 67 runs routines designed to provide visual dynamic control according to the present invention, and the nature of these routines and the control provided are described in further detail below.

in the present embodiment, an array 61 (FIG. 5) of rotary encoders is used in conjunction with an array 77 of 16 selectable input control panels displayed on monitor 21. There is one-to-one position correspondence between the encoder array and the array of displayed control panels. Encoder 73 represents one of the 16 input encoders, and is used to provide a digital value relative to the position of the encoder to CPU 67. Each input encoder is dedicated to one of 16 specific inputs, which are values for parameters of a transfer characteristic to be applied to amplifier 51 in substantially real time. The transfer characteristic is displayable in region 79 of monitor 21, and the display is updated as changes are made in the setting parameters.

Figure 7A:
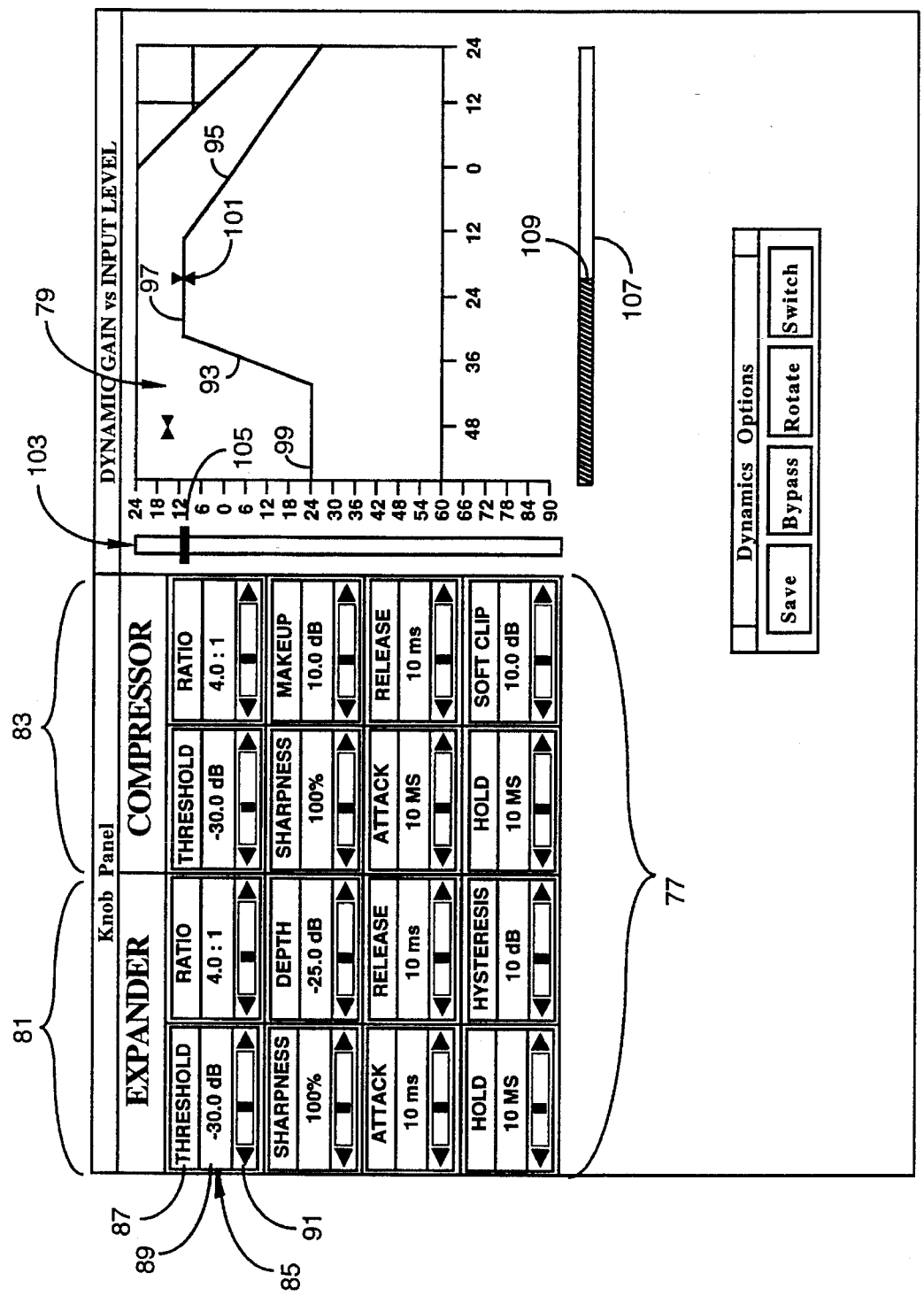
FIG. 7A is an illustration of a display screen on a monitor for a control interface according to an embodiment of the present invention.

FIG. 7A is an illustration of a display according to the present embodiment of the invention on monitor 21 for entering parameters and for following activity of amplifier 51. Group 77 of input control panels is divided into a set 81 for entering parameters for an expander, and a set 83 for entering parameters for a compressor. Control panel 85, as an example, is dedicated to setting threshold point for an expander, and has a title 87, a variable value label 89, and a slide display 91. To enter an expander threshold, an operator manipulates the top left encoder in array 61 to enter new value for the threshold. While the value is adjusted, variable value label 89 changes to display the new value, and slide display 91 moves to indicate the relative value compared to a preprogrammed allowable range.

As described herein, a gate is an expander with a ratio above 10:1, and a limiter is a compressor with a ratio above 10:1 (nominal values depending on definition). Accordingly expanders, gates, compressors, and limiters may all be entered to the transfer characteristic through the control panels shown in FIG. 7A. Each control panel in group 77 is similar to panel 85, having a title, a variable value label, and a slide display, and each panel is associated with an encoder in array 61. For an expander the parameters include, as shown in FIG. 7A:

Threshold:—The input level below which the expander is active.

Ratio:—The multiple applied to an input range to attain the output range for an expander.

Sharpness:—The change in rate in the immediate vicinity of the threshold of the expander.

Depth:—Maximum gain reduction from unity gain for an expander.

Attack:—Time constant for applying gain change when gain is rising.

Release:—Time constant for applying gain change when gain is falling.

Hold:—Time delay before applying release time constant.

Hysteresis:—Change in threshold value depending on direction of change of input signal level (rising or falling).

For a compressor, the parameters are:

Threshold:—The input level above which the compressor (or limiter)is active.

Ratio:—The rate at which compression takes place.

Sharpness:—The change in rate in the immediate vicinity of the threshold.

Makeup:—Gain increase to compensate for compression.

Attack/Release/Hold:—Defined for a compressor in the same way as defined above for an expander.

Soft Clip:—maximum output level to which gradual clipping occurs.

In the present embodiment, transfer characteristics are assumed to have one expander and one compressor, and the operator is responsible for being sure threshold values do not overlap. With the system in operation, control parameter entries are accepted at any time, and the all-points-addressable table is updated frequently, so substantially real time changes may be made. This operation is facilitated by the use of a dedicated DSP in the controlled amplifier unit 51 (FIG. 5), along with interface control through the computer CPU, which provides a multi-tasking environment.

The transfer characteristic is displayed while the system is active in region 79 in two different forms. In FIG. 7A the transfer characteristic is displayed in a graph as dynamic gain vs input level in dB. In this display unity gain appears as a horizontal line, expansion as a region with positive slope, and compression as a region with negative slope. The transfer characteristic shown in FIG. 7A has a gate expander 93, a compressor 95, and two regions of unity gain, 97 and 99.

Figure 7B:
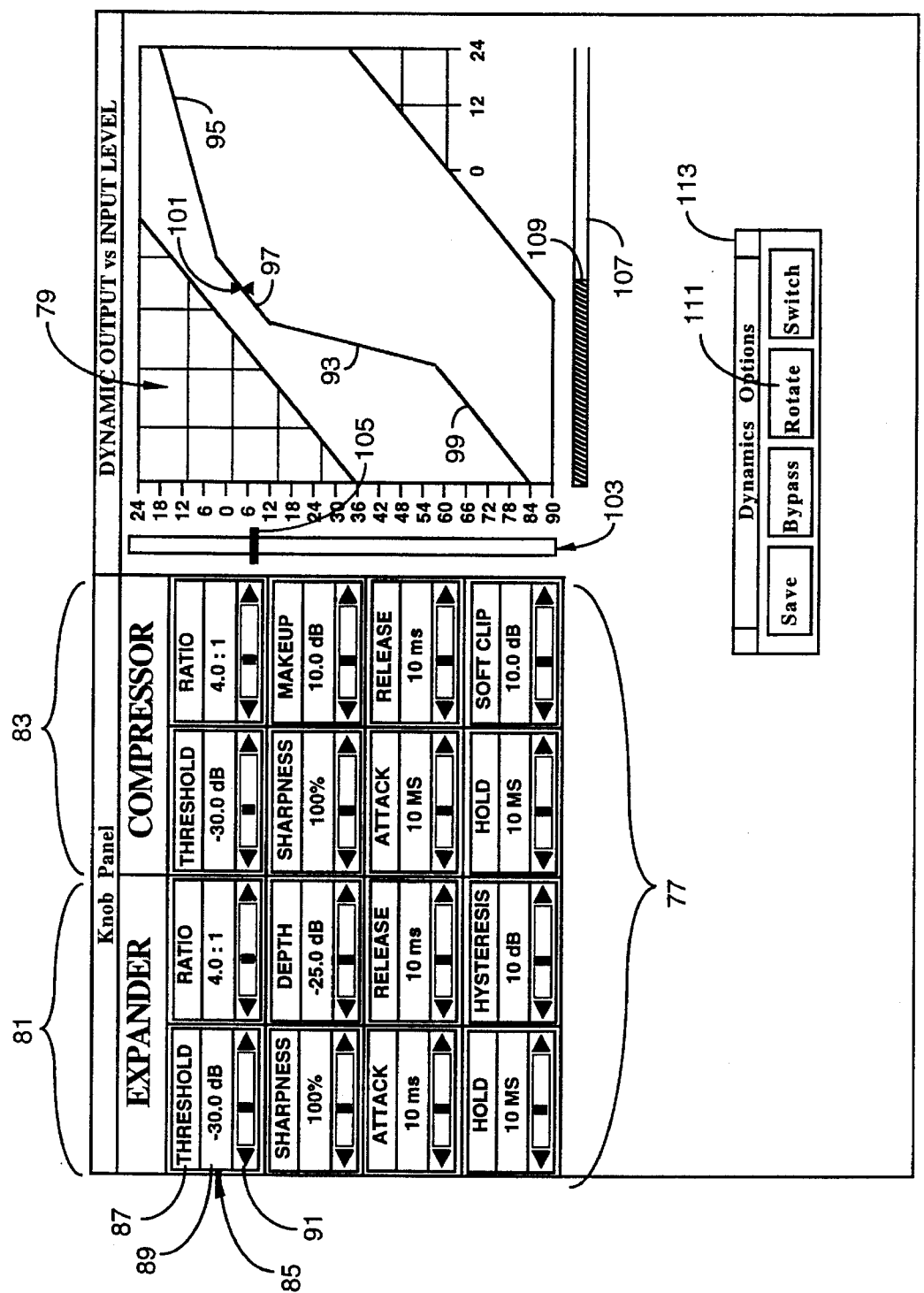
FIG. 7B is another illustration of a display screen similar to FIG. 7A, with a different display mode.

FIG. 7B is similar to FIG. 7A, except display 79 is a graph of output level in dB vs input level in dB, as has been discussed more extensively above. The same regions 93, 95, 97, and 99 are identified. The dynamic gain display is considered a "rotation" of the input vs output display, and an operator may switch from one to the other. One way this switching is accomplished is by selecting a virtual pushbutton labeled "Rotate" in a control window 113 for "Dynamic Options". Control windows of this type, and the use of position-controlled cursors, such as by mouse manipulation, are common in the art of control interfaces.

Figure 7C:
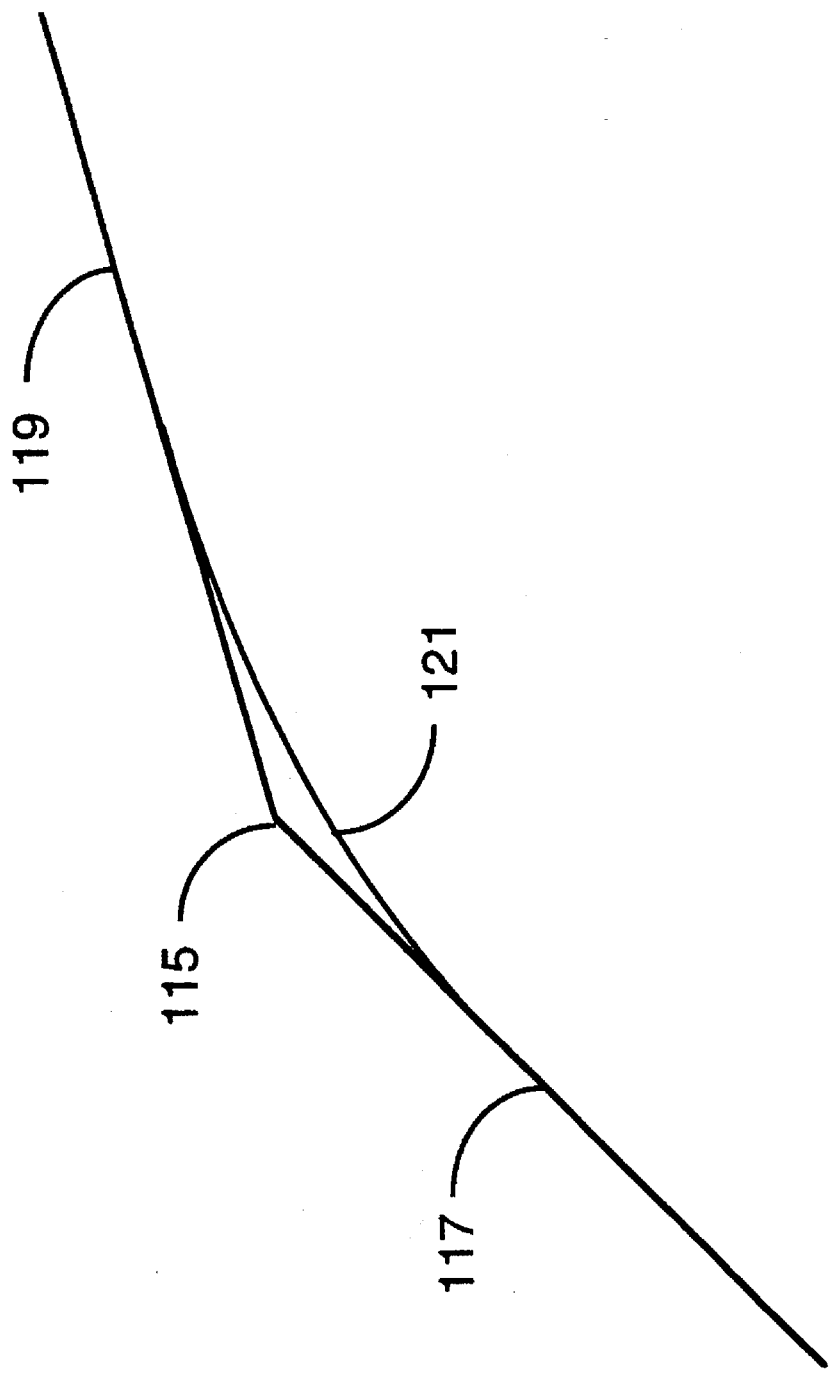
FIG. 7C is an illustration of sharpness around a threshold point in a transfer characteristic.

The time constant type control parameters, such as attack and release time, are not visible on the transfer characteristic. The parameter "sharpness" however, for both a compressor and an expander, are displayable, and displayed on the transfer characteristic. FIG. 7C shows a threshold point 115 between a unity gain region 117 and a compressor region 119 for a transfer characteristic. An alternative curved shape for the two regions at the threshold point is also shown as curve 121. 100% sharpness indicates a point intersection between regions 117 and 119. Sharpness less than 100% provides a curved intersection based on a preprogrammed quadrotic curve function, and the degree relates to the points of tangency of the quadratic curve to the more straight regions. It will be apparent to one with skill in the art that there is a broad range of values over which sharpness may be set, by adjusting the limits of the quadratic function.

There are other virtual pushbuttons in the options window, such as Save, Bypass, and Switch. When the system of the present embodiment is "booted", the configuration of the transfer characteristic and time-constant parameters assume a default value. "Save" allows an operator to save a new configuration as a default after making adjustments at the control interface, so the new configuration will be the default the next time the system is booted.

"Bypass" allows an operator to take the dynamics configuration out of the control circuit. Switch allows an operator to switch between two stored configurations. It will be apparent to one with skill in the art that the options window may be implemented to provide a number of alternative control functions.

The graph display of the transfer characteristic is not a merely static display. Rather, a follower 101 is displayed on the transfer characteristic, and, as the input to the controlled amplifier 51 (not shown in FIG. 7A or 7B) changes, the follower moves along the curve. To the left of the vertical axis (output), a simulated fader 103 with a follower 105 tracks the output generated as a result of the programmed transfer characteristic function applied to the input value. A bar graph 107 with an indicator bar 109 is displayed below the horizontal axis of the graph for tracking the input level to the controlled amplifier. The simulated faders and bar graph are shown in both FIG. 7A and FIG. 7B. In another embodiment of the invention, controlled amplifier 51 has stereo input and selects the input with maximum signal strength as the control input for level detection. In the stereo embodiment display 79 has two bar graphs, one displaying each individual signal of the stereo input. Follower 101 then tracks the larger value displayed in the two bar graphs.

The dynamic tracking functionality with input and output tracking along with a follower on the curve to indicate to an operator exactly where on the transfer characteristic the system is operating provides a unique visual feedback to the user as an aid in programming the dynamic level control.

Referring now to FIG. 6, it is emphasized again that inputs through the operator interface implemented with the screen displays and control panels etc. shown in FIGS. 7A and 7B, are not "hard-wired" inputs as are common in systems prior to the present invention, but are inputs to an all-points-addressable table that is stored in RAM 69 and transferred on a frequent basis to RAM storage in the controlled amplifier 51.

Creation of the all-points-addressable RAM table may also be termed gain versus input level mapping, and determines the gain in the audio signal path based on input signal strength. The circuitry consists primarily of a RAM memory look-up table in RAM 69. The look-up table implements a functional mapping from input signal strength to gain. The digital representation of the input signal, which for operating purposes is extracted by level detection circuitry in the controlled amplifier, and described more fully below, is the independent variable (the RAM address input) and a digital representation of the gain value is the dependent variable (the RAM data output). Since any address can contain any data value (n-bit binary number), the gain-versus-input function is arbitrary. This function describes the fundamental nature of how the audio signal is being processed. Compared to conventional designs, the gain table approach provides a large improvement in flexibility of gain vs input level. This is also the feature which allows an accurate graphical representation to be displayed by the external PC. In addition to the look-up table, a series of digital values for use by the DSP of the controlled amplifier are stored at pre-assigned memory addresses in RAM. These are the values for "attack", "release", and other time constant control parameters as described above.

Another unique advantage provided by the approach of the present invention in creating the all-points-addressable table and storing time-related control parameters as digital values in RAM, is an ability to record a complete control specification, called a "snapshot", for later recall and use. Storage of a snapshot is implemented in different embodiments in different ways, such as by a virtual pushbutton implemented in a control window and accessed by the mouse cursor control. In this embodiment, any time Snapshot is selected, a control routine in the control computer causes a recording of the current gain vs input map (transfer characteristic) and time constant settings to be saved to peripheral storage, such as a hard disk or floppy disk. A similar restore switch may be used to recall a snapshot from disk storage.

FIG. 7D is a table of specifications for dynamics modules and time constant parameters in the present embodiment of the invention.

Figure 8:
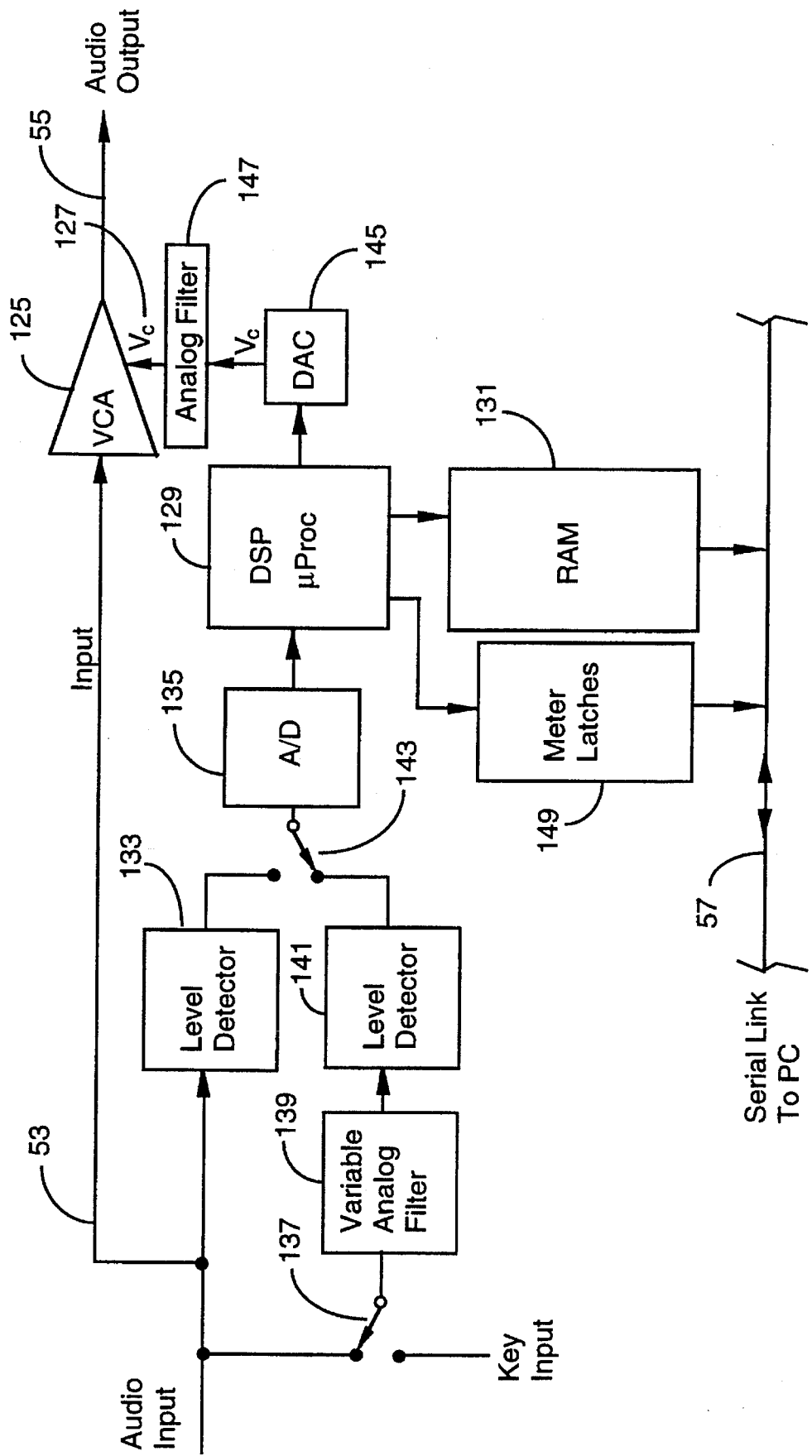
FIG. 8 is a block diagram of circuitry in a controlled amplifier unit according to an embodiment of the present invention.

FIG. 8 is a block diagram of the audio control hardware in controlled amplifier 51 (FIG. 5). Audio input on line 53 is routed to a voltage controlled amplifier 125 which alters the signal level according to variations in voltage $V_c$ on line 127 and provides audio output on line 55. Control voltage $V_c$ is provided by DSP 129 following the transfer characteristic programmed at the operator interface according to descriptions above. The transfer characteristic is recorded in RAM 131 in a look-up table transferred from RAM 69 in computer 54 (FIG. 6) at frequent intervals via serial link 57.

The independent variable for reading the look-up table in RAM 131 is, in most instances, the input level on line 53. Level detection is accomplished through level detection circuitry 133 which monitors the signal strength of incoming audio signals. The circuitry consists of an RMS-to-DC converter and peak (of absolute value) detector. These functions are provided by a single purchased chip. By taking the ratio of peak to RMS level, a Crest Factor signal is also obtained. Both RMS and peak levels are converted logarithmically (voltage is proportional to the log of the signal level) which translates directly to decibels. Therefore, the crest factor is obtained by subtracting the log of RMS level from the log of peak level. Crest factor is used to influence the time constants in an "automatic" mode of dynamics processing. These input level signals are made available to DSP 129 after being passed through an analog-to-digital converter 135.

A switch 137 allows the level detector information to be provided by either the main audio input (the signal to be processed) or an alternate "key" input, so that a separate signal can be used to control the gain element if desired. A variable analog filter 139 may be inserted so that a second detector 141, and thus the gain processing, is more sensitive to certain frequencies. A second switch 143 allows input to A/D converter 135 to be through the second level detector and variable analog filter from the primary audio input. One with skill in the art will recognize that there are equivalent ways to implement this circuitry.

As described above, there are several parameters used in visual audio dynamics control according to the invention that are time constant parameters. These include attack, release, and hold times in the present embodiment. These time constant parameters determine the rate at which the gain is changed from one value to another. DSP 129 implements a digital filtering algorithm. The filter parameters vary depending on input level, gain value, and direction of gain change. The microprocessor reads the output of level detection and then fetches the appropriate gain value from the RAM look-up table. This value becomes the filter input. The microprocessor keeps track of past gain values so that it knows the direction of the gain change. It then computes a new gain value using the proper filter parameters. This control voltage $V_c$ to be sent to the VCA. An analog filter value becomes the filter output. The filter output is sent to a digital-to-analog converter (DAC) 145 which produces 147 between the DAC and the VCA removes high frequencies and glitches from the DAC output signal. At any given time, the filter algorithm performed by the DSP selects from the set of time-constant parameters that have been specified by the user.

The control circuitry at the controlled amplifier unit communicates audio signal strength information back to control computer 54 for visual display. This operation in a general sense is called metering in the art. The circuitry consists of A/D conversion and meter latches 149. The DSP uses the same level detection circuitry described above. Level detector outputs are digitized and stored in latches 149 which can be read directly by control PC 54 over serial link 57. The gain output of the DSP is also stored in a latch for the PC to be used for displaying gain on the appropriate graph on monitor 21. Only the input level and gain need be communicated, as the output value may be obtained by adding the gain to the input.

Figure 9:
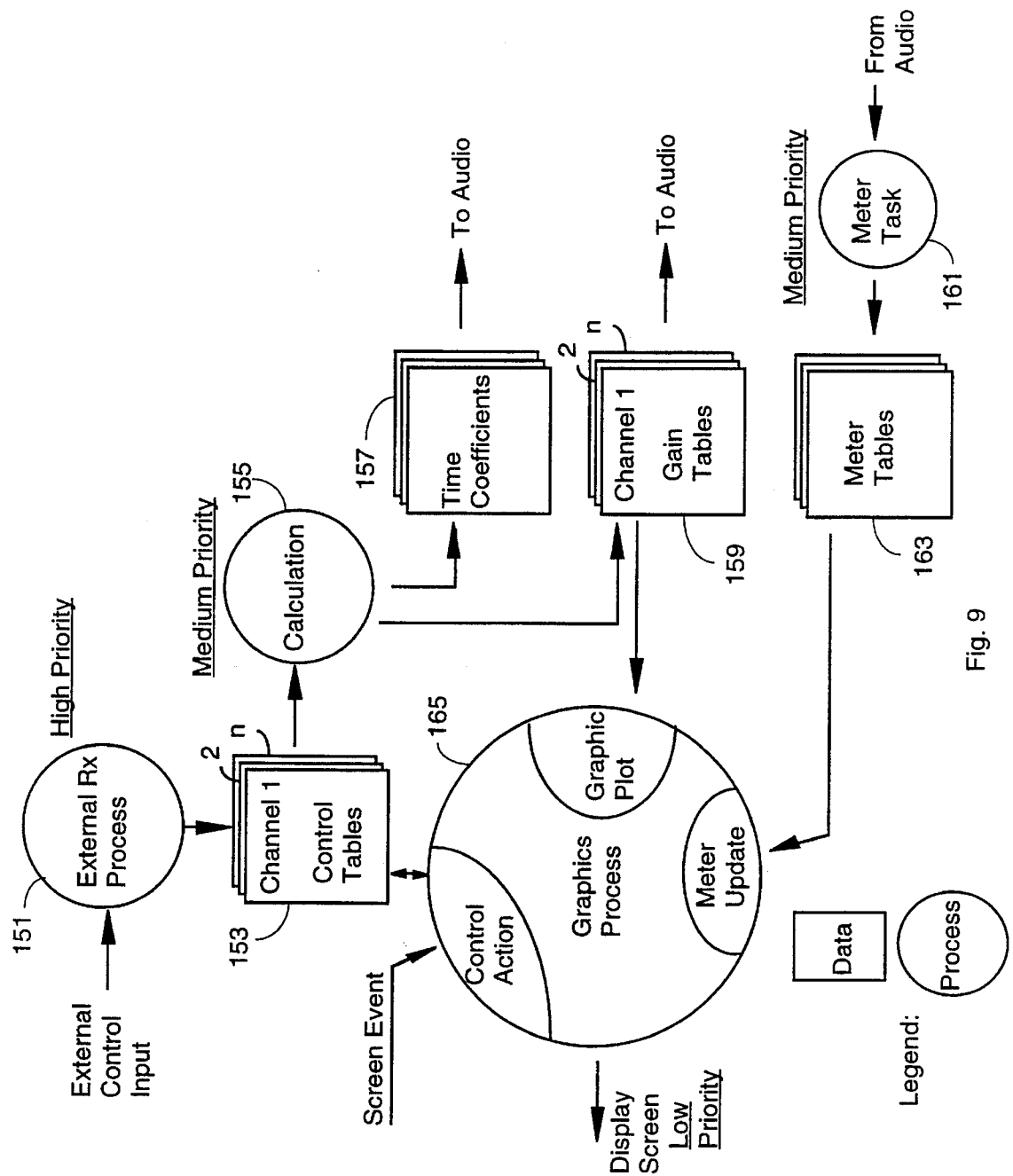
FIG. 9 is a process flow diagram showing the operation of control routines according to an embodiment of the present invention.

FIG. 9 is a diagram showing the process flow for control function routines for the present embodiment of the invention, indicating data storage and priority in operation. External control input to External Rx Process 151 comprises inputs performed by an operator at the operator interface, such as changing the setting of an encoder to change a value for sharpness for a compressor. Control routines 151 translate the rotary position of the encoders (for example) into a digital value representing the appropriate parameter in the range indicated in FIG. 7D, and store that value in control tables 153. This is a high priority task, meaning that if there is a change made in an input setting, that task is done before lower priority tasks. In general, in the control method of the invention, tasks related to audio response take precedence over tasks related to graphical update and display. Other routines 155 read the control tables and generate and update a table of time coefficients 157 and gain tables 159, which are the look-up for gain vs input referred to several times above. This is a medium priority task. Both the time coefficients and the gain tables are stored in computer RAM 69 (FIG. 6) in the present embodiment, and are transferred at frequent intervals to RAM 131 (FIG. 8) at controlled amplifier 51 (FIG. 5).

Routines 161 periodically read meter latches 149 at the controlled amplifier and use that information to update meter tables 163. Graphics routines 165 utilize data from meter tables 163 to update meter displays on monitor screen 21, such as followers 101, 105, and 109, shown in FIGS. 7A and 7B. Other of graphic routines 165 read the gain tables to update the screen display. Graphics routines 165 also read the control tables and screen events as data input in the process of updating the display. Screen events are such as selection of Switch in the Dynamics Options section of the display.

The visual audio dynamics control system of the present invention provides a new level of flexibility and control to audio dynamics control, partly by breaking the "hard-wired" link between inputs and gain control. The system according to the invention uniquely accepts inputs and prepares a look-up table made available to a DSP microprocessor for generating and providing a control voltage to a voltage-controllable amplifier to control gain as a function on audio input. The system also provides substantially real time display of transfer characteristics, output, gain, input, and tracks the control position on the transfer characteristic. Moreover, substantially real time changes may be made in a transfer characteristic without interrupting gain control or display of the characteristic.

Figure 10:
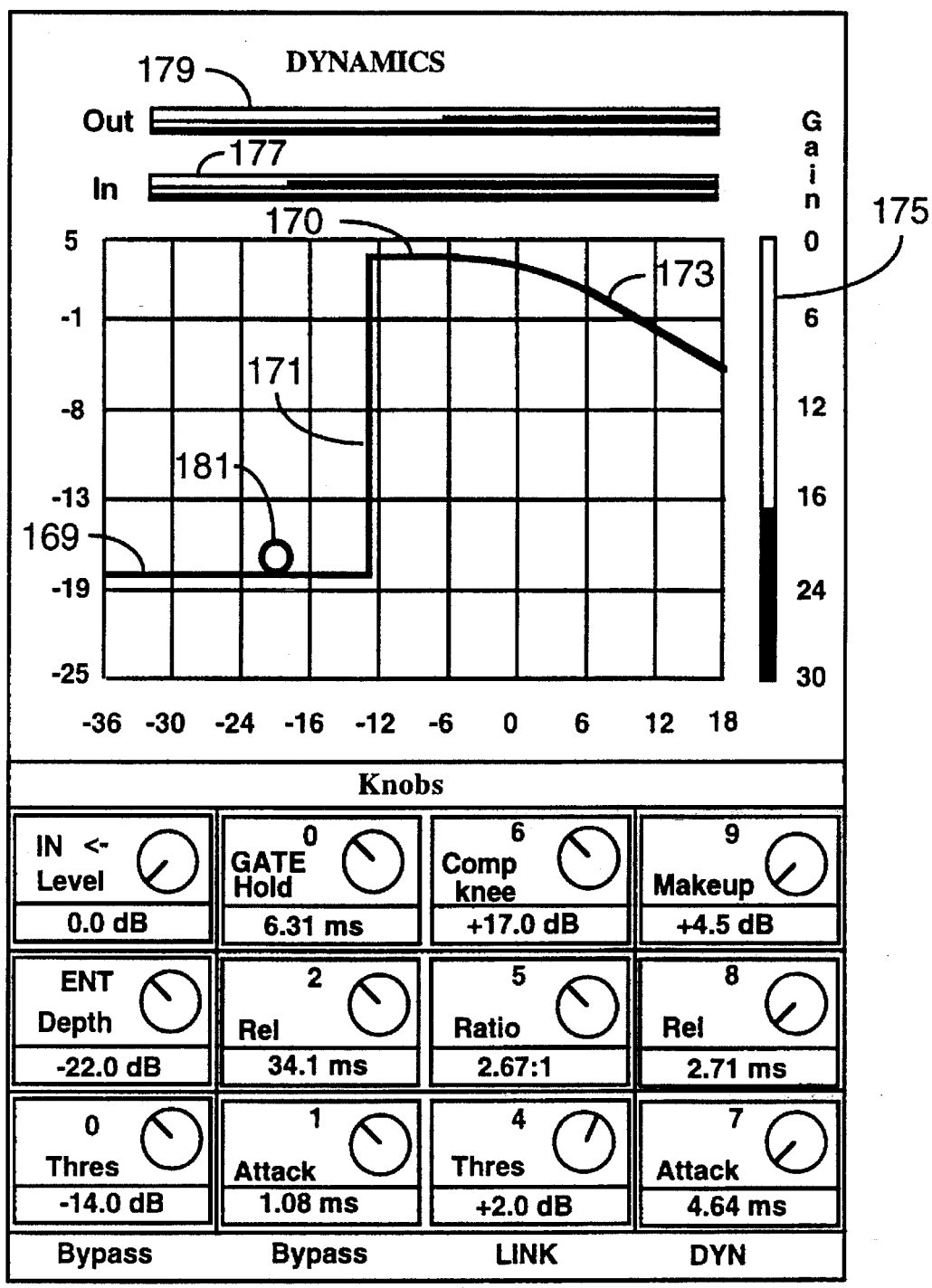
FIG. 10 is an illustration of a display screen in an alternative embodiment of the invention.

FIG. 10 is yet another illustration of a dynamics display screen according to an alternative embodiment of the present invention, In the embodiments depicted by FIGS. 7A and 7B, there is a bar graph 107 with an indicator bar 109 for displaying the input level at the controlled amplifier. In the embodiment of FIG. 10, the display is arranged somewhat differently than in the embodiments described above with reference to FIGS. 7A and 7B. In this specific example, a graphed transfer characteristic 167 is displayed, having unity gain regions 169 and 170, a sharp gate 171, and a compressor region 173, The threshold between unity gain region 170 and compressor 173 is not sharp.

In this alternative display, gain is indicated to the right of the transfer characteristic graph in a dynamic bar graph 175, rather than as a "fader" icon, as shown in the embodiments of FIGS. 7A and 7B. Input and output level are both displayed in horizontal dynamic bar graphs 177 and 179, labeled "In" and "Out" respectively, above the transfer characteristic. In this case each of the input and output level bar graphs is a stereo graph having two bars. Various schemes may be applied for enabling the indicator bars, such as using only the top bar of each for mono input and output.

Presentation of the dynamic input and output level in close proximity, updated in substantially real time, provides a new, intuitive control dimension for an operator. In other embodiments the bar graphs may be side-by-side, and in others the position of each may vary in other ways, still maintaining the close proximity of dynamic input and dynamic output for the convenience of the operator.

In the display of FIG. 10, the follower on the transfer characteristic is a ball 181, which the inventors call the Gain Ball™. In active display, the Gain Ball™ follows the transfer characteristic just as previously described for the follower of FIGS. 7A and 7B.

In FIGS. 7A, 7B, and 10, the vertical axis represents dynamic gain, and dynamic gain values are displayed along the vertical axis. In other embodiments, static gain and dynamic gain values are displayed separately and independently.

One way the static gain is indicated is by normalizing the labeling of the vertical axis to the static gain value. Then the vertical axis shows the actual, or total, gain which is the dynamic gain plus the static gain. The numbers are updated when static gain is varied.

Another way the static gain may be shown is by an on-screen virtual indicator, A virtual knob having a pointer and a scale indicating total static gain range, is positioned on the display to indicate the static gain. A specific static gain knob is not shown in FIG. 10, but may take the form of any one of the knobs shown in the "knobs" section. A reason for having a virtual knob rather than a physical knob is that in some cases static gain may be automatically calculated and changed by control routines according to the invention, based on settings of other control parameters.

By the features described above, display of dynamic gain variations are relative to a fixed gain value, and the moving indicator (element 105 in FIGS. 7A and 7B and the dynamic bar in graph 175 in FIG. 10) along the vertical axis of the gain-vs-input graph is not affected by changes in static gain.

Figure 11A:
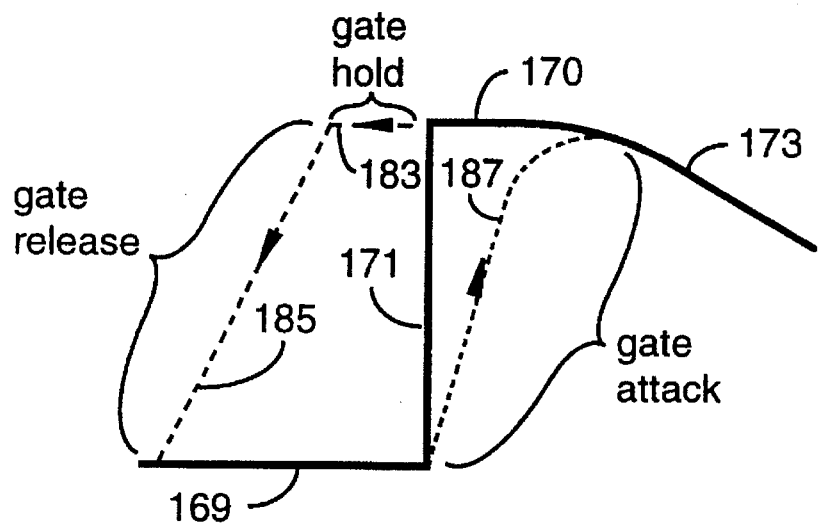
FIG. 11A is an illustration of gate release and gate attack behavior of a curve follower on a transfer characteristic in a display according to an embodiment of the invention.

FIG. 11A shows transfer characteristic 167 of FIG. 10, including unity gain regions 169 and 170, gate 171, and compressor region 173. In this embodiment Gain Ball™ 181 does not strictly follow the transfer characteristic. At and near intersections of expander and compressor regions with other regions of the characteristic, Gain Ball™ 181 is controlled in the display to show time constant. That is, the effect of attack, hold, and release times on the behavior of Gain Ball™ 181 at transition points is displayed by fact of the Gain Ball™ moving to show the actual effect rather than confining the follower to the displayed gain vs input curve (the transfer characteristic).

The time constant parameters effecting movement of the Gain Ball™ are particularly Attack, Release, and Hold times. These concepts were described above, and the definitions are repeated here for convenience.

Attack:—Time constant for applying gain change when input level is rising.

Release:—Time constant for applying gain change when input level is falling.

Hold:—Time delay before applying release time constant.

Gain Ball™ 181 is shown in FIG. 11A on compressor region 173. Dotted lines 183 and 185 with direction arrows show an exemplary track that the Gain Ball™ might follow from region 170 when input level is falling, depending on the hold and release times set. Portion 183 is due to Gate Hold, and portion 185 is due to Gate Release time.

Dotted line 187 with direction arrow shows an exemplary track that the Gain Ball™ might follow when input level is rising from region 169 to region 170, depending on the attack time set.

Figure 11B:
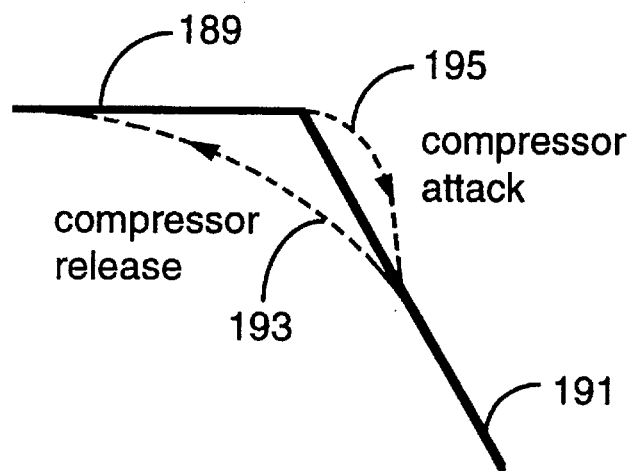
FIG. 11B is an illustration of compressor attack and compressor release behavior of a curve follower on a transfer characteristic in a display according to the invention.

In general, the faster the time constants set, the closer the Gain Ball™ stays to the transfer characteristic curve, FIG. 11B shows a portion of a transfer characteristic with a unity gain region 189 connected to a compressor region 191 with 100% sharpness. Dotted line 193 with direction arrow shows an exemplary track the Gain Ball™ might follow with input level falling, depending on compressor release time set. Dotted line 195 with direction arrow shows an exemplary track the Gain Ball™ might follow with input level rising, depending on compressor attack time set.

Displaying deviation of the Gain Ball™ from the transfer characteristic curve according to time constant parameters provides a new dimension of control not before available to an operator.

It will be apparent to one with skill in the art that there are many alterations and substitutions that may be made in the embodiments of the present invention described above without departing from the spirit and scope of the invention. For example, the interface and display routines may be run on a separate PC as described herein, or the computer components could be built in to a chassis of another unit, such as an audio mixer console. Also, the routines themselves might be implemented in a number of different ways or programming languages, and on computer equipment of several different types.

It will be apparent, too, that there are many equivalent ways to implement parameter input. The method of the present embodiment using an array of rotary encoders related to a similar array of control panels displayed on a monitor screen is but one of many equivalent ways to accomplish the function.

It will be apparent as well that the control circuitry of the controlled unit, which provides a control voltage for a voltage controllable amplifier by reading a look-up table, may be implemented in many different ways as well. Such equivalent designs are regarded by the inventors as within the spirit and scope of the invention.

What is claimed is:

1. In a system for controlling output signal level as a function of input signal level for an automatic gain-control amplifier, the system including a transfer function and at least one time constant for determining gain to be applied to the input signal, a display comprising:

the transfer function as a static curve of gain plotted against input signal strength or of output signal strength plotted against input signal strength; and a dynamic cursor object displayed on the area of the curve of the transfer function;

wherein the dynamic cursor object is positioned on the area of the curve of the transfer function in substantially real time according to the input signal strength, the transfer function, and the time constant.

2. A display as in claim 1 wherein multiple time constants are utilized in displaying the dynamic cursor object.

3. A display as in claim 2 wherein the time constants include attack, release, and hold times.

4. A display as in claim 1 further comprising a dynamic abscissa bar and a dynamic ordinate bar in conjunction with the static curve and the dynamic cursor object, and the position of the dynamic abscissa and ordinate bars is updated in substantially real time.

5. A display as in claim 1 wherein dual abscissa and ordinate bars are displayed, tracking dynamic level of stereo input and output channels.

6. A display as in claim 1 further comprising an array of control panels displaying parameters for the transfer function and time constant values.

7. An operator interface for controlling an output signal of an automatic-gain-control amplifier system relative to an input signal, a transfer function, and at least one time constant, and for displaying the dynamic result of applied control, the operator interface comprising:

input apparatus for an operator to enter values for control variables;

a display; and computerized control circuitry coupled to the display and the input apparatus and adapted for executing the transfer function and for driving the display according to prestored control routines and measured values of input signal strength;

wherein the computerized control circuitry displays a control function on the display as a static curve of gain plotted against input signal strength or of output signal strength plotted against input signal strength, and also displays on the area of the control function a dynamic cursor object, the dynamic cursor object positioned on the area of the curve of the transfer function in substantially real time according to the input signal strength, the transfer function, and the time constant.

8. An operator interface as in claims 7 wherein multiple time constants are utilized in displaying the dynamic cursor object.

9. An operator interface as in claim 8 wherein the time constants include attack, release, and hold times.

10. An operator interface as in claim 7 further comprising a dynamic abscissa bar and a dynamic ordinate bar in conjunction with the static curve and the dynamic cursor object, and the position of the dynamic abscissa and ordinate bars is updated in substantially real time.

11. An operator interface as in claim 10 wherein dual abscissa and ordinate bars are displayed, tracking dynamic level of stereo input and output channels.

12. An operator interface as in claim 7 further comprising an array of control panels displaying parameters for the transfer function and time constant values.

13. An operator interface as in claim 7 wherein the computerized control circuitry executes the control function and displays the dynamic cursor object according to measured values of a tracked key audio signal rather than measured values of input signal strength.

14. An operator interface as in claim 13 further comprising a switching apparatus for switching control between measured values of input signal strength and a the tracked key audio signal.

15. An operator interface as in claim 7 wherein the input signal is a stereo signal, and the computerized control circuitry executes the transfer characteristic and displays the dynamic cursor object according to the greater of the signal strengths of the stereo inputs.

16. In an automatic-gain-control amplifier system including a transfer characteristic and at least one time constant for applying the transfer characteristic, a method for displaying information to an operator, comprising steps of:

(a) displaying the transfer characteristic on a display screen as a static curve of gain plotted against input signal strength or of output signal strength plotted against input signal strength; and (b) displaying a dynamic cursor object in the same area as the static curve;

wherein the position of the dynamic cursor object is updated in substantially real time according to the input signal strength, the transfer characteristic, and the time constant.

17. The method of claim 16 wherein multiple time constants are associated with the transfer characteristic for applying the transfer characteristic to the input signal strength.

18. The method of claim 17 wherein the multiple time constants include attack, release, and hold times.

19. The method of claim 16 including a step for displaying at least one of a dynamic abscissa or a dynamic ordinate bar, wherein the amplitude of the bar display is updated in substantially real time.

20. The method of claim 16 wherein the transfer characteristic and the dynamic cursor object are displayed according to a tracked key audio signal rather than the input signal strength.

21. The method of claim 16 wherein the input signal is a stereo input, and the computerized control circuitry displays the dynamic cursor object according to the greater of the signal strengths of the stereo inputs.

* * * * *